United States Patent [19]

Wiechmann et al.

[11] 4,262,363
[45] Apr. 14, 1981

[54] SIGNAL SEEKING STOP CIRCUIT FOR AMPLITUDE MODULATED RECEIVER

[75] Inventors: Eldred H. Wiechmann, Kokomo; Richard A. Kennedy, Russiaville; Myron G. Padgett, Greentown, all of Ind.

[73] Assignee: General Motors Corporation, Detroit, Mich.

[21] Appl. No.: 64,804

[22] Filed: Aug. 8, 1979

[51] Int. Cl.³ .............................................. H03J 7/18
[52] U.S. Cl. .............................................. 455/161
[58] Field of Search ............... 455/161, 168, 169, 164, 455/77; 358/193.1

[56] References Cited

U.S. PATENT DOCUMENTS

| | | | |
|---|---|---|---|
| 2,884,519 | 4/1959 | Masselin | 455/164 |
| 3,599,099 | 8/1971 | Tatebayashi | 455/161 |
| 3,947,774 | 3/1976 | Glennon et al. | 455/169 |

*Primary Examiner*—Jin F. Ng
*Attorney, Agent, or Firm*—Albert F. Duke

[57] ABSTRACT

A circuit for terminating the signal seeking mode of operation of an AM receiver includes a comparator which responds to a composite signal comprising a broadband IF signal and the detected IF signal strength. A control signal is produced when the composite signal exceeds a predetermined threshold. The broadband component of the composite signal is effective as a blanking potential when the receiver is off-channel. A second comparator is utilized to establish local sensitivity so that local and distant sensitivity settings are not interrelated.

3 Claims, 1 Drawing Figure

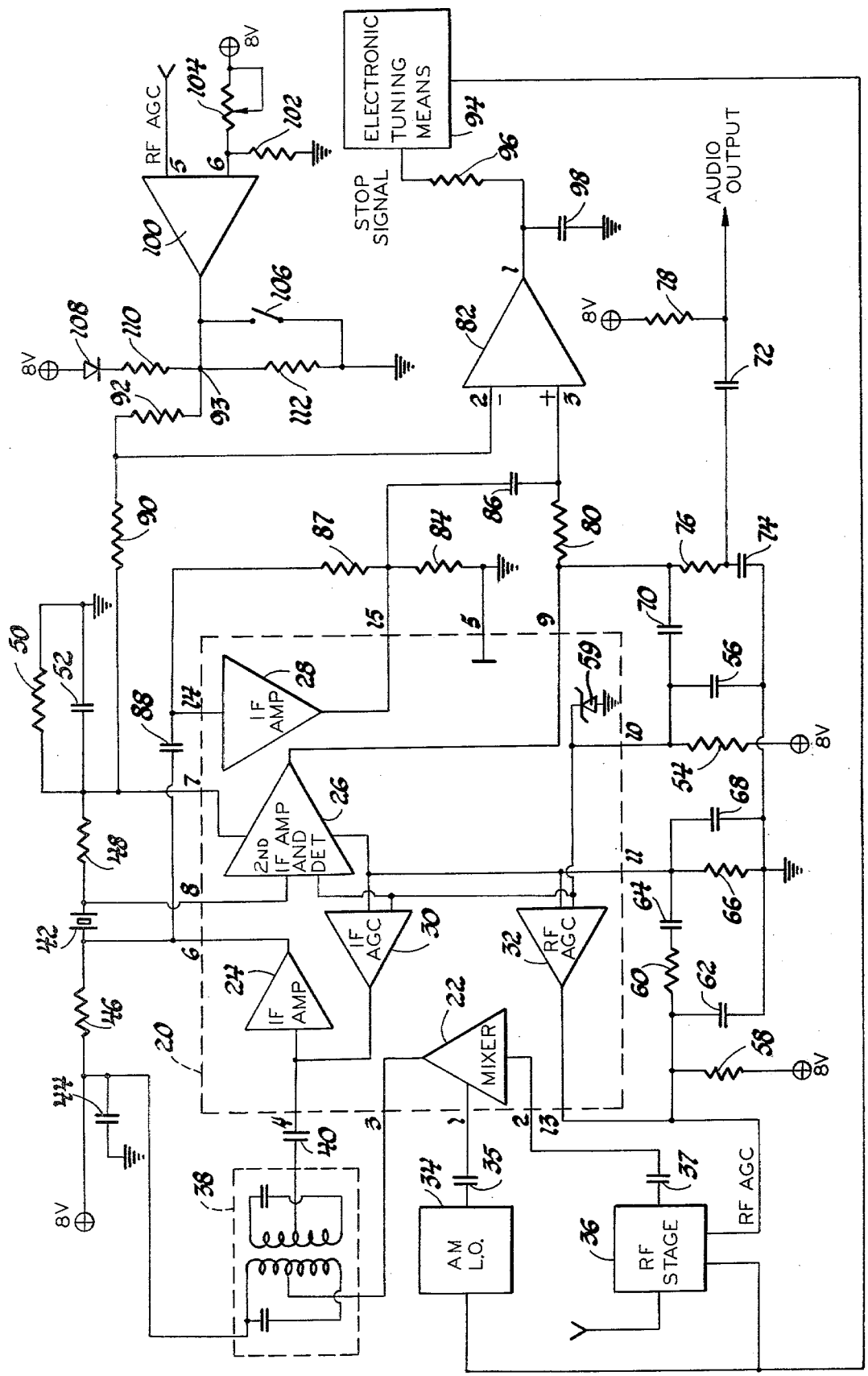

SIGNAL SEEKING STOP CIRCUIT FOR AMPLITUDE MODULATED RECEIVER

FIELD OF THE INVENTION

This invention relates to signal seeking radio receivers and, more particularly, to a signal seeking AM receiver including an improved stop circuit for controlling exit from the signal seeking mode of operation.

BACKGROUND OF THE INVENTION

Amplitude modulated receivers are known in the art which operate in a signal seeking or search mode and include a stop circuit which generates a stop signal to deactivate the signal seeking mode. One prior art stopping circuit includes a first comparator, or level detector which compares the rectified and filtered IF singal with a threshold potential established by a biasing network to detect when the receiver is on-channel. The prior art circuit also includes a second comparator which compares the level of the detected audio signal to another threshold potential established by a second biasing network. The outputs of the two comparators are used to generate a stop signal when the receiver is on-channel and a desired signal strength is present. One of the problems associated with this configuration is that a low bias threshold level is required and other variables are introduced which in effect lower and compress the comparator operating thresholds to a marginal level. At this marginal level, temperature variations and offset voltage fluctuations can cause erroneous operation of the stopping circuit manifested by stopping prior to, or subsequent to, the center of the channel or skipping desired channels. Also, in receivers including a local/distant mode of operation, two different signal strengths must be detected. In the past, a compromise in the local and distant mode sensitivity setting has been necessary.

It is an object of the present invention to provide a signal seeking stop circuit for an amplitude modulated receiver which improves on-channel stopping characteristics without degrading the receiver's overall performance.

It is another object of the present invention is to provide an amplitude modulated receiver operative in a signal seeking mode wherein sensitivity adjustment for a local mode of operation is independent of the distant mode sensitivity setting.

SUMMARY OF THE INVENTION

In accordance with the present invention a comparator or voltage level detector having a relatively high potential, temperature compensation, threshold level is responsive to a composite signal, including both AC and DC components, for detecting when the receiver is on-channel and whether the strength of the received signal is sufficient to terminate the signal seeking mode of operation of the receiver. The composite signal consists of a broadband IF signal superimposed on the DC level of the audio detector output of the receiver.

The superimposed broadband IF signal is effective as a blanking potential prior to, and subsequent to, a channel since it is at a high level during these conditions and at a low level during on-channel conditions. When the receiver is being tuned through the channel, the relative decrease in the IF signal level and the rapid increase in DC level at the detector output causes the comparator to produce a stop signal. A second comparator is utilized to establish a local sensitivity setting so that local and distant sensitivity settings are not interrelated.

A more complete understanding of the present invention may be had from the following detailed description which should be read in conjunction with the single drawing showing a detail schematic of the present invention.

DESCRIPTION OF THE PREFERRED EMBODIMENT

Referring now to the single FIGURE, the circuitry enclosed within the dotted line 20 is an AM receiver subsystem such as the RCA-CA3088E. The RCA-CA3088E is described in Application Note ICAN-6022 available from RCA Solid State Division, Box 3200, Summerville, New Jersey. The Application Note is incorporated herein. The module 20 includes a mixer 22, a first IF amplifier 24, a second IF amplifier and detector 26, an IF amplifier 28 and IF and RF AGC amplifiers 30 and 32, respectively. Pin 1 of the module 20 is coupled to an AM local oscillator, generally indicated at 34, through capacitor 35, while pin 2 of the module 20 is coupled to the RF stage, generally designated 36, through capacitor 37. The output of the mixer 22 at pin 3 is connected with a transformer 38 which provides the IF input to the amplifier 24 through capacitor 40. The output of the amplifier 24 is coupled from pin 6 through ceramic filter 42 to pin 8 and the amplifier/detector 26. A capacitor 44 serves as a filter for the 8-volt input to the module 20. Resistors 46 and 48 provide the proper impedance to ceramic filter 42. Resistor 50 and capacitor 52 bias and filter the IF amplifiers to stabilize gain and minimize distortion. Resistor 54 and capacitor 56 connected with pin 10 of the module 20 form a filter network for the internal 5-volt regulator zener diode 59. Resistors 58, 60 and capacitors 62, 64 filter and couple the RF AGC voltage at pin 13 to IF AGC components comprising resistor 66 and capacitor 68 connected with pin 11. This feeedback improves AGC action by reducing AGC voltage overshoot during the initial period of on-channel conditions that occur when strong signal levels are received. The detected audio at pin 9 of module 20 is filtered and coupled by capacitors 70, 72 and 74 and resistors 76 and 78 to interface the audio output with potential levels in additional audio processing circuitry (not shown).

The output of the detector 26, at pin 9, consists of the detected audio modulation offset by a DC voltage corresponding to the narrow band IF signal strength. The DC voltage is coupled through a resistor 80 to pin 3 of a voltage comparator 82. The audio signal at pin 9 is filtered out by a network comprising resistors 80 and 84 and capacitor 86. The broadband IF signal at pin 6 is coupled through a capacitor 88 to pin 14 for further amplification by the amplifier 28 and coupled from pin 15 through the capacitor 86 to form a composite potential at pin 3 of comparator 82. Resistor 87 is a biasing resistor for amplifier 28.

The threshold potential of comparator 82 is established at pin 2 thereof by voltage dividing the internally compensated bias potential at pin 7 of module 20. The ratio of resistors 90 and 92 connected between pin 7 of module 20 and a junction 93 determines the threshold level of comparator 82. The output at pin 9 of module 20 tracks pin 7 with regard to temperature variations and accordingly the threshold established at pin 2 of comparator 82 is temperature compensated. The output of comparator 82 at pin 1 thereof, is low whenever the input at pin 3 is below the threshold established at pin 2. Whenever the input at pin 3 exceeds the threshold of pin 2, the output of comparator 82 goes high to generate a logic level stop signal which is detected by digital logic in electronic tuning means generally designated 94 to terminate the signal seeking mode of operation. Resistor 96 and capacitor 98 establish a time constant which prevents the output of the comparator 82 from varying at the IF rate. In other words, the output of the comparator 82 does not respond to the broadband IF signal component at the input thereof.

A comparator 100 has its threshold potential at pin 6 established by resistor 102 and a potentiometer 104. The input to the comparator 100 is from the RF AGC signal at pin 13 of the module 20. A local/distant switch 106 grounds junction 93 when in the distant position to establish the threshold potential at comparator 82 as the ratio of resistors 90 and 92. When the switch 106 is in the local position, a diode 108 and resistors 110 and 112 increase the threshold level at comparator 82 well above the threshold level established when the switch 106 is in the distant position. This threshold level remains high until the RF AGC voltage applied to pin 5 of comparator 100 exceeds the threshold at pin 6 of the comparator 100 thereby grounding junction 93 and reestablishing the threshold at comparator 82 as the ratio of resistors 90 and 92.

The operation of the circuit is as follows assuming that the local/distant switch 106 is in the distant position. During off-channel conditions, the broadband IF signal component of the composite potential applied to pin 3 of comparator 82 experiences large excursions in relation to the excursions occurring during on-channel conditions. The negative excursions of the broadband IF signal prior to, and after a channel blanks the comparator output, preventing any stop signal from being generated. When the receiver is being tuned through the channel, the broadband IF excursions are substantially reduced due to the increased signal level from the filter 42 which activates the IF AGC and reduces the IF gain of the aplifier 24. Also, when the receiver is being tuned to the channel, a rapid increase in DC Level at the pin 3 input to the comparator 82 occurs. The composite signal at pin 3, when the receiver is being tuned through the channel, exceeds the bias level established at pin 2 causing the output of comparator 82 to turn off allowing pin 1 of the comparator 82 to go positive through resistor 96 and produce the stop signal. Thus, the composite signal at pin 3 of comparator 82 is effective as a blanking potential during off-channel conditions while providing an accurate exit from the signal seeking mode when the receiver is on-channel.

If the local/distant switch 106 is placed in the local position, the threshold at pin 2 of comparator 82 rises to a level above that established when the switch 106 is in the distant position so that a greater strength is required to initiate the stop signal. The local mode sensitivity is established by the ratio of resistor 102 potentiometer 104. When the AGC voltage applied to pin 5 of comparator 100 exceeds this threshold junction 93 is returned to ground and the threshold potential at comparator 82 is returned to that which existed during the distant mode of operation which causes the stop signal to be generated since the signal level at pin 3 will be large due to the strong local signal being received. The local mode sensitivity adjustment is therefore independent of the distant mode sensitivity setting.

The embodiments of the invention in which an exclusive property or privilege is claimed are defined as follows:

1. An amplitude modulated receiver operable in a signal seeking mode of operation, said receiver comprising, means for producing an IF signal, means for filtering said IF signal, means responsive to said filtered IF signal for producing a DC signal representing the signal strength of said filtered IF signal, comparator means, means applying a composite signal comprising said IF signal and said DC signal to one input of said comparator means, time delay means connected with the output of said comparator means for preventing the output of said comparator means from following the IF input rate, means establishing a predetermined threshold voltage at another input of said comparator means, said comparator means producing a control signal for terminating said signal seeking mode of operation when said composite input signal exceeds said predetermined threshold voltage.

2. An amplitude modulated receiver operable in a signal seeking mode of operation, said receiver comprising, means for producing an IF signal, means for filtering said IF signal, means responsive to said filtered IF signal for producing a DC voltage representing the signal strength of said filtered IF signal, comparator means, means applying a composite signal comprising said IF signal and said DC signal to one input of said comparator means, time delay means connected with the output of said comparator means for preventing the output of said comparator means from following the IF input rate, means establishing a predetermined temperature compensated threshold voltage at another input of said comparator means, said comparator means producing a control signal for terminating said signal seeking mode of operation when said composite input signal exceeds said predetermined threshold voltage.

3. An amplitude modulated receiver operable in a signal seeking mode of operation, said receiver comprising, means producing an IF signal, means for filtering said IF signal, means responsive to said filtered IF signal for producing a DC signal representing the signal strength of said filtered IF signal, means providing an automatic gain control signal, first comparator means, means applying a composite signal comprising said IF signal and said DC signal to one input of said first comparator means, a local/distant switch, said switch having a distant position establishing a predetermined temperature compensated threshold voltage at a second input of said first comparator means and having a local position establishing a higher threshold voltage at said second input of said first comparator means, second comparator means responsive to said automatic gain control signal exceeding a second predetermined voltage for reestablishing said predetermined temperature compensated threshold voltage at said first comparator means, time delay means connected with the output of said first comparator means for preventing the output of said first comparator means from following the IF input rate, said first comparator means producing a control signal for terminating said signal seeking mode of operation when said composite input signal exceeds said first predetermined threshold voltage.

* * * * *